United States Patent
Ino et al.

(10) Patent No.: US 10,096,619 B2
(45) Date of Patent: Oct. 9, 2018

(54) SEMICONDUCTOR DEVICE, MANUFACTURING METHOD FOR SEMICONDUCTOR DEVICE, AND FERROELECTRIC LAYER

(71) Applicant: Toshiba Memory Corporation, Minato-ku (JP)

(72) Inventors: Tsunehiro Ino, Fujisawa (JP); Shosuke Fujii, Kuwana (JP); Seiji Inumiya, Toshima (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/257,064

(22) Filed: Sep. 6, 2016

(65) Prior Publication Data

US 2016/0372478 A1  Dec. 22, 2016

Related U.S. Application Data

(63) Continuation of application No. PCT/JP2015/057696, filed on Mar. 16, 2015.

(30) Foreign Application Priority Data

Mar. 17, 2014  (JP) .................................. 2014-053993

(51) Int. Cl.
*H01L 27/115* (2017.01)
*H01L 27/1159* (2017.01)
(Continued)

(52) U.S. Cl.
CPC ........ *H01L 27/1159* (2013.01); *C23C 14/083* (2013.01); *H01L 21/02181* (2013.01);
(Continued)

(58) Field of Classification Search
CPC .......... H01L 21/02181; H01L 21/3105; H01L 27/11507; H01L 27/11514; H01L 27/1159;
(Continued)

(56) References Cited

U.S. PATENT DOCUMENTS

| | | |
|---|---|---|
| 5,555,219 A | 9/1996 | Akiyama et al. |
| 2006/0214204 A1 | 9/2006 | Yoo et al. |

(Continued)

FOREIGN PATENT DOCUMENTS

| | | |
|---|---|---|
| JP | 6-204429 | 7/1994 |
| JP | 6-334140 | 12/1994 |

(Continued)

OTHER PUBLICATIONS

Dayu Zhou et al. "Wake-up Effects in Si-doped Hafnium Oxide Ferroelectric Thin Films", Applied Physics Letters, vol. 103, 2013, 5 pages.

(Continued)

*Primary Examiner* — Shahed Ahmed
(74) *Attorney, Agent, or Firm* — Oblon, McClelland, Maier & Neustadt, L.L.P.

(57) ABSTRACT

A semiconductor device according to an embodiment includes a first conductive layer, a second conductive layer, and a ferroelectric layer including hafnium oxide provided between the first conductive layer and the second conductive layer, a sum of hafnium (Hf) and oxygen (O) in the hafnium oxide being 98 atomic percent or more.

8 Claims, 10 Drawing Sheets

(51) Int. Cl.
*H01L 27/11507* (2017.01)
*H01L 49/02* (2006.01)
*C23C 14/08* (2006.01)
*H01L 29/78* (2006.01)
*H01L 21/02* (2006.01)
*H01L 21/3105* (2006.01)
*H01L 27/11514* (2017.01)
*H01L 27/11597* (2017.01)
*G11C 11/22* (2006.01)
*H01L 29/51* (2006.01)

(52) U.S. Cl.
CPC .... *H01L 21/02266* (2013.01); *H01L 21/3105* (2013.01); *H01L 27/11507* (2013.01); *H01L 27/11514* (2013.01); *H01L 27/11597* (2013.01); *H01L 28/40* (2013.01); *H01L 29/517* (2013.01); *H01L 29/78391* (2014.09); *G11C 11/221* (2013.01); *H01L 29/516* (2013.01)

(58) Field of Classification Search
CPC .............. H01L 27/11597; H01L 28/40; H01L 29/516; H01L 29/517; H01L 29/78391
USPC ...................... 257/295, 428; 438/3, 728, 732
See application file for complete search history.

(56) References Cited

U.S. PATENT DOCUMENTS

| | | | |
|---|---|---|---|
| 2007/0045689 A1 | 3/2007 | Lim et al. | |
| 2008/0199975 A1 | 8/2008 | Park et al. | |
| 2009/0097309 A1 | 4/2009 | Mizukami et al. | |
| 2012/0176834 A1* | 7/2012 | Ikeda .................. | H01L 27/0688 365/148 |
| 2013/0071984 A1* | 3/2013 | Wang ...................... | H01L 45/08 438/382 |
| 2013/0234086 A1 | 9/2013 | Sonehara | |
| 2014/0183433 A1 | 7/2014 | Sonehara | |
| 2014/0347912 A1* | 11/2014 | Siau ....................... | G11C 7/062 365/148 |
| 2016/0005961 A1 | 1/2016 | Ino | |

FOREIGN PATENT DOCUMENTS

| | | |
|---|---|---|
| JP | 10-287494 | 10/1998 |
| JP | 10-316495 | 12/1998 |
| JP | 2000-243090 | 9/2000 |
| JP | 2006-270095 | 10/2006 |
| JP | 2007-43166 | 2/2007 |
| JP | 2008-199030 | 8/2008 |
| JP | 2009-88446 | 4/2009 |
| JP | 2013-187523 | 9/2013 |
| JP | 2015-15334 | 1/2015 |

OTHER PUBLICATIONS

J. Mueller et al. "Ferroelectric Zr0.5Hf0.5O2 Thin Films for Non-volatile Memory Applications", Applied Physics Letters, vol. 99, 2011, 4 pages.

T. S. Boescke et al. "Phase Transitions in Ferroelectric Silicon Doped Hafnium Oxide" Applied Physics Letters, vol. 99, 2011, 4 pages.

T. S. Boescke et al. "Ferroelectricity in Hafnium Oxide Thin Films", Applied Physics Letters, vol. 99, 2011, 4 pages.

English Translation of International Search Report dated Apr. 7, 2015 in PCT/JP2015/057696 filed Mar. 16, 2015.

Kostas Sarakinos et al. "On the Phase Formation of Sputtered Hafnium Oxide and Oxynitride Films", Journal of Applied Physics, vol. 108, No. 014904, 2010, 9 pages.

J. M. Leger et al. "Pressure-induced Phase Transitions and Volume Changes in $HfO_2$ up to 50 GPa", Physical Review B, vol. 48, No. 1, Jul. 1, 1993, 6 pages.

F.C. Kartawidjaja et al. "Ferroelectric and Dielectric Behavior of Heterolayered PZT Thin Films", Journal of Applied Physics, vol. 102, 2007, 7 pages.

T. Olsen et al. "Co-Sputtering Yttrium into Hafnium Oxide Thin Films to Produce Ferroelectric Properties", Applied Physics Letters, vol. 101, 2012, 5 pages.

J. Mueller et al. "Ferroelectricity in Yttrium-doped Hafnium Oxide", Journal of Applied Physics, vol. 110, 2011, 6 pages.

Japanese Office Action dated Dec. 1, 2015 in Japanese Application 2015-525671 (with English Translation), 5 pages.

Japanese Office Action dated Aug. 2, 2016 in Japanese Application 2015-525671 (with English Translation), 9 pages.

* cited by examiner

SEMICONDUCTOR DEVICE, MANUFACTURING METHOD FOR SEMICONDUCTOR DEVICE, AND FERROELECTRIC LAYER

CROSS-REFERENCE TO RELATED APPLICATION

This application is continuation application of, and claims the benefit of priority from the International Application PCT/JP2015/057696, filed Mar. 16, 2015, which claims the benefit of priority from Japanese Patent Application No. 2014-053993, filed on Mar. 17, 2014, the entire contents of all of which are incorporated herein by reference.

FIELD

Embodiments described herein relate generally to a semiconductor device, a manufacturing method for a semiconductor device, and a ferroelectric layer.

BACKGROUND

Since it is apparent that there is a limit in scaling-down a non-volatile semiconductor memory in related arts in which silicon (Si) is used for a front end process, examination has been started on various kinds of non-volatile semiconductor memories in which new materials are used, such as a resistive random access memory (ReRAM), a phase change random access memory (PCRAM), and a magnetic random access memory (MRAM).

Among these non-volatile semiconductor memories, for example, a ferroelectric random access memory (FeRAM) in which a ferroelectric substance is used has not been put into a practical use because of various factors, except that the FeRAM is used for a small-sized memory such as a radio frequency identification (RFID) card for the purpose of power saving. Examples of the factors are an inclusion of material difficult to handle such as lead, and difficulty in film-thinning due to a size effect, and so on.

Particularly, since ferroelectric substances having low affinity with a semiconductor process such as lead, bismuth, and barium are needed to be used, there is the scaling-down limit while the process is becoming more complex. Further, an application range is also limited because manufacturing cost can be hardly reduced.

DETAILED DESCRIPTION

A semiconductor device according to an embodiment includes: a first conductive layer; a second conductive layer; and a ferroelectric layer including hafnium oxide provided between the first conductive layer and the second conductive layer, a sum of hafnium (Hf) and oxygen (O) in the hafnium oxide being 98 atomic percent or more.

In the present specification, note that an identical or similar member will be denoted by a same reference sign and repetition of the same description may be omitted.

In the present specification, note that a "ferroelectric substance" represents the substance that has spontaneous polarization even without applying an electric field from the outside, and has the polarization reversed when an electric field is applied from the outside. Further, in the present specification, note that an "antiferroelectric film substance" represents the substance not having spontaneous polarization as a whole because plural sub-lattices respectively have polarization of different directions in a crystal including at least two or more of the sub-lattices and when polarization of all of the sub-lattices are summed, respective polarization are cancelled one another. Furthermore, in the present specification, note that a "paraelectric substance" represents the substance that generates polarization when an electric field is applied, and eliminates the polarization when the electric field is removed.

In the present specification, a fact that the value obtained by multiplying the number of oxygen ions inside the layer by the valence 2 of oxygen is smaller than the value obtained by multiplying the number of positive ions by the valence of the positive ion indicates a characteristic of a film in which composition is controlled such that the number of divalent oxygen ions becomes less than two for each Hf ion that is a tetravalent positive ion, different from, for example, a film representing $(HfO_2)_x(SiO_2)_{1-x}$ that is a stoichiometric ratio generated by a normal film forming method using HfSiO that may be universally observed as a general abbreviated notation and may also be used in an embodiment.

Embodiments of the present disclosure will be described below with reference to the drawings.

First Embodiment

A semiconductor device according to the present embodiment includes: a first conductive layer; a second conductive layer; and a ferroelectric layer including hafnium oxide provided between the first conductive layer and the second conductive layer, a sum of hafnium (Hf) and oxygen (O) in the hafnium oxide being 98 atomic percent or more.

Further, the ferroelectric film according to the present embodiment is hafnium oxide in which a sum of hafnium (Hf) and oxygen (O) is 98 atomic percent or more.

Figure 1:
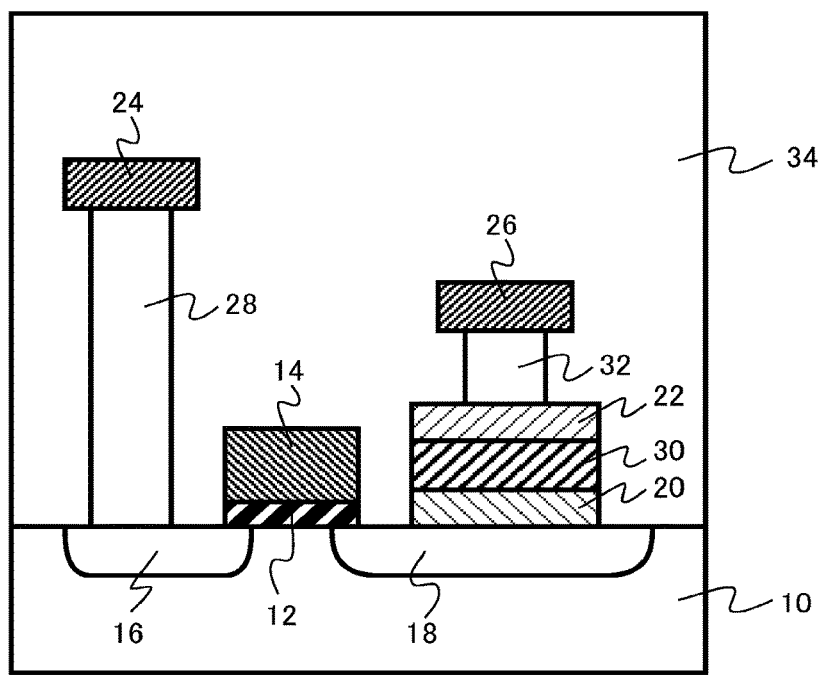
FIG. 1 is a schematic cross-sectional view illustrating a semiconductor device according to a first embodiment.

FIG. 1 is a schematic cross-sectional view illustrating the semiconductor device according to the present embodiment. The semiconductor device according to the present embodiment is a non-volatile semiconductor memory device. The semiconductor device according to the present embodiment is a FeRAM of one-transistor and one-capacitor type (1T1C type) in which a transistor for memory cell selection and a capacitor adopting a ferroelectric substance as a dielectric film are combined.

The semiconductor device according to the present embodiment includes a semiconductor substrate 10, a gate insulating film 12 formed on the semiconductor substrate 10, and a gate electrode 14 formed on the gate insulating film 12. A source impurity layer 16 and a drain impurity layer 18 are formed on a surface of the semiconductor substrate 10 on both sides of the gate electrode 14. The transistor for memory cell selection is formed of the semiconductor substrate 10, gate insulating film 12, gate electrode 14, source impurity layer 16, and drain impurity layer 18. The gate electrode 14 functions as a word line of the FeRAM.

The semiconductor substrate 10 is, for example, single-crystal silicon (Si). Besides the single-crystal silicon (Si), a substrate of single-crystal germanium (Ge), single-crystal silicon germanide (SiGe), single-crystal indium phosphide (InP), single-crystal gallium arsenide (GaAs), indium gallium zinc oxide (IGZO), or the like can be used. The substrate is preferably suitable for forming a peripheral circuit using a semiconductor device.

The gate insulating film 12 is, for example, a silicon oxide film. The gate electrode 14 is, for example, polycrystalline silicon in which impurities are introduced. The source impurity layer 16 and the drain impurity layer 18 are formed by, for example, diffusing arsenide (As) that is an n-type impurity into the semiconductor substrate 10.

Further, the semiconductor device according to the present embodiment includes a lower capacitor electrode (first conductive layer) 20 and an upper capacitor electrode (second conductive layer) 22. Further, a ferroelectric film 30 of hafnium oxide is formed between the lower capacitor electrode 20 and the upper capacitor electrode 22.

A capacitor to store memory data is formed by the lower capacitor electrode 20, upper capacitor electrode 22, and ferroelectric film 30. The capacitor according to the present embodiment has a so-called metal/ferroelectrics/metal (MFM) type structure. The upper capacitor electrode 22 is provided on the drain impurity layer 18 and electrically connected.

The lower capacitor electrode 20 and the upper capacitor electrode 22 are formed of, for example, conductive metal and metallic compounds. An example is titanium nitride (TiN). A film thickness of titanium nitride (TiN) is, for example, 1 nm or more and 10 nm or less.

Preferably, materials of the lower capacitor electrode 20 and the upper capacitor electrode 22 are materials having a small reactive property with the hafnium oxide film 30 and further having a resistance property against processing at temperature of 550° C. or more and 900° C. or less, such as highly-doped poly-Si, TaN, WN, HfN, ZrN, TaAlN, WAlN, HfAlN, ZrAlN, Ru, Ir, Os, and Pt, besides TiN.

Further, preferably, the lower capacitor electrode (first conductive layer) 20 or the upper capacitor electrode (second conductive layer) 22 has hardness not damaged even when a diamond-coated cantilever of an atomic force microprobe (AFM) is made to contact at pressure of 4 μN. In the case where the hardness is larger than 4 μN, the lower capacitor electrode 20 or the upper capacitor electrode 22 is peeled off together with the semiconductor substrate 10 on the base or the ferroelectric film 30 of hafnium oxide. This presumably occurs because the lower capacitor electrode 20 or the upper capacitor electrode 22 has Vickers hardness of 15 GPa or more. In the case where the hardness is lower than the mentioned hardness, the ferroelectric film 30 is hardly manufactured.

Here, occurrence of damage is determined based on AFM observation, scanning electron microscopy (SEM) observation, or optical observation. Further, standards of the cantilever are: model No. type CDT-NCHR manufactured by Nano World AG (cantilever thickness 3.5-4.5 μm, width 25-35 μm, length 120-130 μm, spring rate 42-142 N/m, resonant frequency 280-510 kHz, distal end curvature radius 100-200 nm).

Further, in the lower capacitor electrode (first conductive layer) 20 or the upper capacitor electrode (second conductive layer) 22, preferably, a value obtained by multiplying the number of oxygen ions inside the layer by a valence 2 of oxygen is smaller than a value obtained by multiplying the number of positive ions by a valence of the positive ion. More specifically, the material having a small oxygen amount included inside the layer is preferable. When oxygen is excessively included at the time of manufacturing a capacitor structure, ferroelectricity may not be realized in the hafnium oxide film 30. By providing nearby the material in which the value obtained by multiplying the number of oxygen ions by the valence 2 of oxygen is smaller than the value obtained by multiplying the number of positive ions by the valence of the positive ion, excessive oxygen inside the hafnium oxide film 30 is absorbed.

In the ferroelectric film 30 of hafnium oxide according to the present embodiment, the sum of hafnium (Hf) and oxygen (O) is 98 atomic percent or more. The hafnium oxide according to the present embodiment is additive-free hafnium oxide to which elements other than hafnium (Hf) and oxygen (O) are not actively added.

In hafnium oxide, zirconium (Zr) tends to be inevitably mixed while being manufactured. In the ferroelectric film 30 of hafnium oxide according to the present embodiment, a sum of hafnium (Hf), oxygen (O), and zirconium (Zr) inside hafnium oxide is 99 atomic percent or more.

Meanwhile, amounts of hafnium (Hf), oxygen (O), and zirconium (Zr) inside hafnium oxide can be measured by, for example, secondary ion mass spectrometry (SIMS), electron energy loss spectroscopy (EELS), transmission electron microscope-energy dispersive x-ray spectroscopy (TEM-EDX), high angle annular dark-field scanning-transmission electron microscopy (HAADF-STEM), and so on.

In the ferroelectric film 30 according to the present embodiment, a main component is hafnium oxide having a crystal structure of a space group $Pbc2_1$ (space group number 29). As an accessory component, hafnium oxide having crystal structure of a space group Pbca (space group number 61), a crystal structure of space group $P4_2/nmc$ (space group number 137), a crystal structure of space group Fm3m, or a crystal structure of space group $P2_1/c$ may be included. The crystal structure of the ferroelectric film 30 can be measured by, for example, X-ray diffraction method using radiation light or a far-infrared microspectroscopic method using radiation light.

Preferably, the ferroelectric film 30 has a film thickness of 1 nm or more and 16 nm or less, more preferably, 1 nm or more and 10 nm or less. In the case where the film thickness is smaller than the above range, leak current may be increased. Further, in the case where the film thickness is larger than the above range, a film having ferroelectricity is hardly manufactured.

Further, the semiconductor device according to the present embodiment includes a bit line 24 and a plate line 26. The bit line 24 is electrically connected to the source impurity layer 16 via a contact plug 28. The plate line 26 is connected to the upper capacitor electrode 22 via a contact plug 32. The bit line 24, plate line 26, contact plug 28, contact plug 32 are formed of, for example, conductive metal and metallic compounds.

An interlayer dielectric film 34 is provided between respective wiring, electrode, and the contact plugs. The interlayer dielectric film 34 is, for example, a silicon oxide film.

In the FeRAM according to the present embodiment, a memory cell is selected by the word line at the time of data writing, and a polarization direction of the ferroelectric film 30 is changed by applying voltage between the bit line 24 and the plate line 26. At the time of data reading, pulse voltage is applied, and whether the data is "1" or "0" is determined by whether current flow is caused by polarization reversal.

In the following, a manufacturing method for the semiconductor device and the ferroelectric film according to the present embodiment will be described with reference to FIG. 1.

The manufacturing method for the semiconductor device according to the present embodiment includes: preparing a first conductive layer; forming a hafnium oxide film having antiferroelectricity or ferrielectricity on the first conductive layer, in which a sum of hafnium (Hf) and oxygen (O) is 98 atomic percent or more; forming the second conductive layer on the hafnium oxide film; and performing first heat treatment at temperature of 550° C. or more and 900° C. or less.

First, the semiconductor substrate 10 is prepared. The semiconductor substrate 10 is, for example, single-crystal silicon (Si) including a (100) plane.

Next, the gate insulating film 12 and the gate electrode 14 are formed on the semiconductor substrate 10 by using a known manufacturing method. The gate insulating film 12 is, for example, a silicon oxide film. The gate electrode 14 is, for example, polycrystalline silicon in which impurities are introduced.

The source impurity layer 16 and the drain impurity layer 18 are formed on the surface of the semiconductor substrate 10 on both sides of the gate electrode 14 by using a known manufacturing method. The source impurity layer 16 and the drain impurity layer 18 are formed by performing, for example, ion-implantation of arsenide (As) that is an n-type impurity into the semiconductor substrate 10.

Next, the lower capacitor electrode (first conductive layer) 20 is formed on the drain impurity layer 18. As the lower capacitor electrode 20, for example, TiN (titanium nitride) is deposited.

A deposition method of the lower capacitor electrode 20 is, for example, a sputtering method. Other methods such as a chemical vapor deposition (CVD) method, an atomic layer deposition (ALD) method, and an electron beam (EB) evaporation method may also be adopted.

From the viewpoint of manufacturing a film having high ferroelectricity, it is preferable that the lower capacitor electrode 20 has strength so as not to be damaged even when a diamond cantilever of an atomic force microprobe (AFM) is made to contact at pressure of 4 µN.

Further, in the lower capacitor electrode 20, it is preferable that a value obtained by multiplying the number of oxygen ions by a valence 2 of oxygen is smaller than a value obtained by multiplying the number of positive ions by a valence of the positive ions from the viewpoint that the lower capacitor electrode 20 absorbs excessive oxygen to manufacture the film having high ferroelectricity.

Next, the hafnium oxide film 30 having antiferroelectricity or ferrielectricity is formed on the lower capacitor electrode 20. The hafnium oxide film 30 is formed by, for example, the sputtering method.

Preferably, the hafnium oxide film 30 formed on the lower capacitor electrode 20 has a crystal structure of the space group Pbca (space group number 61) or the space group number $P4_2/nmc$ (space group number 137) from the viewpoint of having antiferroelectricity or ferrielectricity.

Further, the film having antiferroelectricity or ferrielectricity is not limited to the space group Pbca and the space group $P4_2/nmc$, and may have other structures.

For example, in $Pbc2_1$ exhibiting ferroelectricity, there are two kinds of oxygen atoms: an oxygen atom O1 contributing to ferroelectric polarization; and an oxygen atom O2 not contributing to ferroelectric polarization. In the $Pbc2_1$, the atom O1 and the atom O2 are arranged in layer-like forms inside a crystal $HfO_2$, and an O1 atom layer contributing to ferroelectric polarization and an atom layer O2 not contributing to ferroelectric polarization are alternately arranged in the order of, for example, . . . Hf atom layer/O1 atom layer/Hf atom layer/O2 atom layer/Hf atom layer/O1 atom layer, and so on.

In the Pbca, a double-cycle crystal structure of $Pbc2_1$ is formed by arranging atom layers in the order of, for example, . . . Hf atom layer/O1 atom layer/Hf atom layer/O2 atom layer/Hf atom layer/O3 atom layer/Hf atom layer/O2 atom layer/Hf atom layer/O1 atom layer, and so on. Here, the O3 atom layer corresponds to the oxygen atom contributing to polarization same as the O1 atom layer. However, when the O3 atom layer is displaced in a direction opposite to O1, polarization by O1 atom is cancelled, thereby forming an antiferroelectric state in which polarization directions are alternately reversed.

In the $P4_2/nmc$, arrangement is made in the order of . . . /Hf atomic row/O1 atomic row/Hf atomic row/O3 atomic row/Hf atomic row/O1 atomic row . . . in an a-axis direction, and . . . /Hf atomic row/O1 atomic row/Hf atomic row/O3 atomic row/Hf atomic row/O1 atomic row . . . in a b-axis direction, thereby forming the antiferroelectric state in which the O1 atomic row and the O3 atomic row having polarizing directions opposite to each other are alternately arranged.

Further, there may be other crystal structures, for example: a crystal structure of weak ferroelectricity (hereinafter referred to as a WS structure) in which arrangement is made in the order of . . . Hf atom layer/O1 atom layer/Hf atom layer (/O2 atom layer/Hf atom layer)×n layer(s)/O1 atom layer . . . (however, n is an integer of 1 or more); a crystal structure of antiferroelectricity (hereinafter referred to as an AS structure) in which arrangement is made in the order of . . . Hf atom layer/O1 atom layer (/Hf atom layer/O2 atom layer)×n layer(s)/Hf atom layer/O3 atom layer (/Hf atom layer/O2 atom layer)×m layer(s)/Hf atom layer/O1 atom layer . . . (however, n and m are integers of 1 or more); and a crystal structure of ferrielectricity (hereinafter referred to as an FS structure) in which arrangement is made in the order of . . . (/Hf atom layer/O1 atom layer/Hf atom layer/O2 atom layer)×n layer(s) (/Hf atom layer/O3 atom layer/Hf atom layer/O2 atom layer)×m layer(s)/Hf atom layer/O1 atom layer . . . (however, n and m are integers of 1 or more and n≠m). The WS structure, AS structure, and FS structure are hardly observed even in an X-ray diffraction test using radiation light, but these structures may exist.

Therefore, from the viewpoint of having antiferroelectricity or ferrielectricity, the hafnium oxide film 30 formed on the lower capacitor electrode 20 may also be hafnium oxide of the WS structure, AS structure, or FS structure.

Further, in an X-ray photoelectron spectroscopy (XPS) spectrum of the hafnium oxide film 30, it is preferable to have a trivalent peak of Hf at 4f peak of Hf from the viewpoint that the hafnium oxide film 30 formed on the lower capacitor electrode 20 has antiferroelectricity or ferrielectricity. The above trivalent peak of Hf is not necessarily formed in a clear peak shape, and it is rather preferable that the trivalent peak of Hf is formed as a shoulder of the tetravalent peak of Hf, or not even formed as such a peak shoulder and just exhibits abundance that can identify presence of Hf trivalence by peak separation. Further, preferably, there is no zero valence of Hf, more specifically, no peak by Hf metal. Additionally, more preferably, there is no peak of a positive divalence and positive monovalence of Hf.

In the case of forming the hafnium oxide film 30 by the sputtering method, preferably, a substrate temperature is a room temperature from the viewpoint of having antiferroelectricity or ferrielectricity. Further, preferably, sputtering conditions include film forming conditions not to damage the substrate as much as possible, more specifically, the film is formed under sputtering gas pressure of 1 Pa or more and the substrate and a target are arranged off-axially. Further, a method of performing chemical conversion sputtering in an $Ar+O_2$ atmosphere by using Hf metal as the sputtering target is preferable. In this case, a gas flow rate ratio of $Ar:O_2$ is preferably controlled to 10:1 or less.

Preferably, the hafnium oxide film 30 has a film thickness of 1 nm or more and 16 nm or less, more preferably, 1 nm or more and 10 nm or less. In the case where the film thickness is smaller than the above range, leak current may be increased. Further, in the case where the film thickness is larger than the above range, the hafnium oxide film 30 is hardly changed to a film having ferroelectricity in subsequent manufacturing steps.

A film forming method for the hafnium oxide film 30 may also be other methods such as the CVD method, ALD method, and EB evaporation method.

Meanwhile, preferably, an Hf metal film is formed before the hafnium oxide film 30. By forming the Hf metal film, the Hf metal film reacts with the hafnium oxide film 30 in a subsequent process, and antiferroelectricity or ferrielectricity can be easily realized in the hafnium oxide film 30. The Hf metal film has a film thickness equivalent to several atom layers, for example, 0.3 nm or more and 1.0 nm or lower.

Even when the Hf metal film is formed on the hafnium oxide film 30 after forming the hafnium oxide film 30, the same effect can be expected.

Next, the upper capacitor electrode (second conductive layer) 22 is formed on the hafnium oxide film 30. As the upper capacitor electrode 22, for example, TiN (titanium nitride) is deposited.

A deposition method of the upper capacitor electrode 22 is, for example, the sputtering method. Other methods such as the CVD method, ALD method, and EB evaporation method may be also adopted.

From the viewpoint of manufacturing a film having high ferroelectricity, preferably, the upper capacitor electrode 22 has strength so as not to be damaged even when the diamond cantilever of AFM is made to contact at pressure of 400 µN.

Further, in the upper capacitor electrode 22, it is preferable that a value obtained by multiplying the number of oxygen ions by a valence 2 of oxygen is smaller than a value obtained by multiplying the number of positive ions by a valence of the positive ions from the viewpoint that the upper capacitor electrode 22 absorbs excessive oxygen to manufacture the film having high ferroelectricity.

After forming the upper capacitor electrode 22, heat treatment (first heat treatment) is performed at temperature 550° C. or more and 900° C. or less. Crystallization of the hafnium oxide film 30 is accelerated by this heat treatment.

Preferably, the heat treatment (first heat treatment) is performed in a non-oxidizing atmosphere from the viewpoint of suppressing excessive oxygen supply to the hafnium oxide film 30. The atmosphere of heat treatment is an inert gas atmosphere such as a nitrogen atmosphere and an argon atmosphere. A heat treatment device is sufficiently vacuumed by a turbo-molecular pump, and uses the inert gas having a dew point of −140° C. or less, and oxygen partial pressure at the room temperature is estimated as 1E-4 Pa.

More preferably, the temperature of heat treatment (first heat treatment) is 600° C. or more and 800° C. or less. When the temperature is either lower or higher than the above temperature range, film having high ferroelectricity may not be finally formed. Further, from the viewpoint of reducing thermal damage in other wiring layers and the like, it is more preferable that an entire manufacturing process is performed at lower temperature of 700° C. or less.

Preferably, a period of the heat treatment (first heat treatment) is 1 millisecond or more and 60 seconds or less. In the case where the period is shorter than the above range, the hafnium oxide film 30 may not be sufficiently crystallized. Further, in the case where the period is longer than the above range, there is a possibility that diffusion of impurities from an external atmosphere cannot be suppressed in the upper capacitor electrode (second conductive layer) 22. Further, in the case where the period is longer than the above range, the lower capacitor electrode (first conductive layer) 20 and the upper capacitor electrode (second conductive layer) 22 may react with the hafnium oxide film 30.

For example, the heat treatment (first heat treatment) is performed in the nitrogen atmosphere at 700° C. for 20 seconds.

Next, patterning is applied to the lower capacitor electrode (first conductive layer) 20, hafnium oxide film 30, and upper capacitor electrode (second conductive layer) 22 by a known manufacturing method. After that, the interlayer dielectric film 34, contact plug 28, contact plug 32, bit line 24, and plate line 26 are formed by a known manufacturing method.

Next, a process to realize ferroelectricity in the hafnium oxide film 30 is performed. This process is a crystal structure changing process in which energy of a certain level or more is applied to the hafnium oxide film 30 and the crystal structure having antiferroelectricity or ferrielectricity is changed to the crystal structure having ferroelectricity.

The crystal structure changing process is, for example, the process to apply voltage having an absolute value of 1.4 V or more to the hafnium oxide film 30 by using the lower capacitor electrode (first conductive layer) 20 and the upper capacitor electrode (second conductive layer) 22 as two terminals. Since polarization reversal voltage of hafnium oxide is 1.4 V, when the voltage less than 1.4 V is applied, the crystal structure is not changed to the crystal structure having ferroelectricity. Preferably, the voltage to be applied is 5 V or less from the viewpoint of preventing breakage of the semiconductor device.

A preferable range of an electric field to be applied to the hafnium oxide film 30 is 1.4 MV/cm or more and 5 MV/cm or less.

A voltage application period is, preferably, 30 seconds or more and 90 seconds or less in total at an AC frequency of 1 MHz or less. Further, the number of times to apply the voltage is, preferably, once or more and three times or less.

Further, the crystal structure changing process is the process to irradiate the hafnium oxide film 30 with infrared, for example. Since the infrared is transmissive even when the lower capacitor electrode 20 and the upper capacitor electrode 22 are metal thin film electrodes, energy can be effectively applied to the hafnium oxide film 30. The infrared has a wave number of, preferably, 330 cm$^{-1}$ or more and 550 cm$^{-1}$ or less, and 240 cm$^{-1}$ or more and 270 cm$^{-1}$ or less, and more preferably, 350 cm$^{-1}$ or more and 500 cm$^{-1}$ or less, especially preferably, 380 cm$^{-1}$ or more and 430 cm$^{-1}$ or less. There is no harm in using the infrared out of the above-mentioned range, however; there may be a problem in which an effect of changing the crystal structure is deteriorated Further, luminance of the emitted infrared is, preferably, 1E9 photons/second/mrad/0.1% BW or more or more and 1E11 photons/second/mrad/0.1% BW or less. In the case where the luminance is the above range or less, there may be a problem in that the effect of changing the crystal structure is deteriorated, and in the case where the luminance is the above range or more, there may be a problem in that an adverse effect is given to portions other than the hafnium oxide film 30.

Further, the crystal structure changing process is heat treatment (second heat treatment) performed at 550° C. or more and 700° C. or less, for example. The heat treatment (second heat treatment) is, preferably, performed in a non-oxidizing atmosphere from the viewpoint of suppressing excessive oxygen supply to the hafnium oxide film 30. The atmosphere of heat treatment is the inert gas atmosphere such as the nitrogen atmosphere and the argon atmosphere. Particularly, it is preferable that oxygen is preliminarily removed by a high-vacuum pump, such as the turbo-molecular pump, until reaching a partial pressure of 1E-2 Pa or less. More preferably, oxygen is removed until reaching to the partial pressure of 1E-4 Pa or less. In the case where the partial pressure of oxygen is higher than the above-mentioned value, there may be a problem in that oxygen permeates the hafnium oxide film 30 via the upper capacitor electrode 22 and the crystal structure is changed to an unfavorable crystal structure of a space group P2$_1$/c, for example.

The semiconductor device illustrated in FIG. 1 is manufactured by the above-described manufacturing method.

In the following, functions and effects of the present embodiment will be described.

According to the ferroelectric film of hafnium oxide of the present embodiment, introducing elements such as Si, Zr, Al, Y, Sr, and Gd is not needed in order to realize ferroelectricity. In the case of introducing, for example Al, Y, Sr, Gd, etc. in the front end process of manufacturing the semiconductor device, there may be adverse effects given to other processes. In order to prevent the adverse effects, various countermeasures are taken and there is a problem in that the manufacturing cost is increased. Further, in the case of Zr, for example, a ratio between Hf and Zr is needed to be kept half-and-half in order to realize ferroelectricity, thereby causing the problem of increasing the manufacturing cost. Furthermore, in the case of Si, for example, an additive amount is needed to be precisely controlled to a small amount such as 4% or so in order to specially obtain ferroelectricity in a thin film of 10 nm or less, thereby also causing the problem of increasing the manufacturing cost.

Additionally, in order to realize ferroelectricity in the hafnium oxide film including the elements such as Si, Zr, Al, Y, Sr, and Gd, high-temperature heat treatment is desirably performed, compared to the hafnium oxide film of the present application in the case where manufacturing is performed under the same conditions as the present application. Therefore, there may be concern in which thermal damages are given to other films and wiring formed in the semiconductor device.

According to the present embodiment, the additive-free hafnium oxide to which elements other than hafnium (Hf) and oxygen (O) are not actively added is used as the ferroelectric film. Therefore, the manufacturing cost is reduced and further low-temperature formation at 900° C. or less can be performed.

As a result, the ferroelectric film having stable characteristics and the semiconductor device including such a ferroelectric film can be implemented.

According to the present embodiment, the additive-free ferroelectric hafnium oxide film is manufactured by forming the additive-free hafnium oxide film having antiferroelectricity or ferrielectricity is formed and then changing this film to the hafnium oxide film having ferroelectricity.

Figure 2:
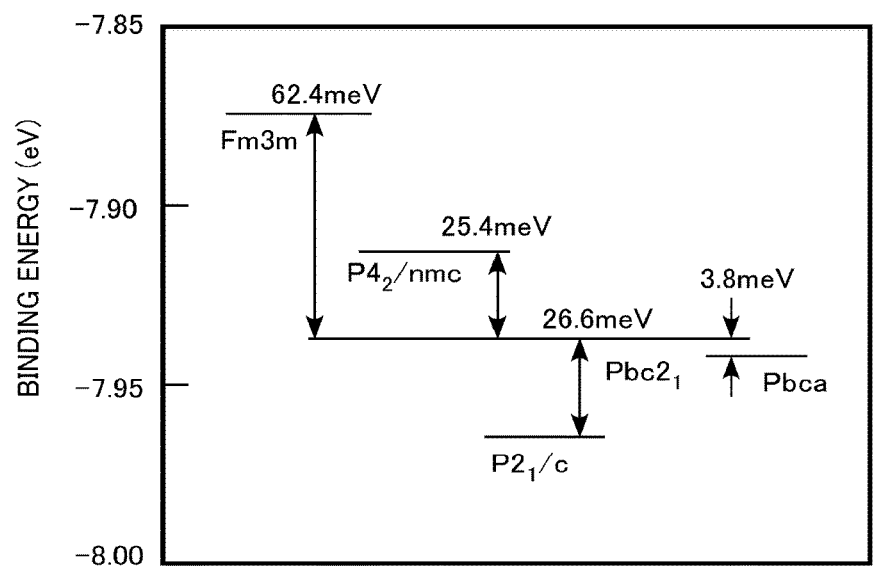
FIG. 2 is an explanatory diagram illustrating functions of the first embodiment.

FIG. 2 is an explanatory diagram illustrating functions of the present embodiment. FIG. 2 is a diagram illustrating a relation between the crystal structure of hafnium oxide and binding energy. Pbc2$_1$ represents a crystal structure having ferroelectricity, and Pbca and P4$_2$/nmc represents crystal structures having antiferroelectricity.

Here, in the case of polarization reversal of hafnium oxide, a crystal structure at a saddle point of potential sensed by a displaced oxygen atom is Fm3m. As illustrated in FIG. 2, the binding energy in the crystal structure of Fm3m is higher than binding energy of any one of the crystal structures of Pbc2$_1$, Pbca, P4$_2$/nmc, and P2$_1$/c.

Therefore, after the crystal structure is changed to the crystal structure of Fm3m by applying energy to hafnium oxide by voltage application or the like, phase transition to any one of the crystal structures of Pbc2$_1$, Pbca, P4$_2$/nmc, and P2$_1$/c can be easily performed. Meanwhile, transition between the crystal structures of Fm3m, Pbc2$_1$, Pbca, P4$_2$/nmc, and P2$_1$/c is martensitic transition.

In a state that energy such as voltage is applied to hafnium oxide, the crystal structure of Pbc2$_1$ in which dielectric polarization is aligned has the lowest energy. Therefore, it can be considered that in the state that energy such as voltage is applied, phase transition to the crystal structure of Pbc2$_1$ having ferroelectricity is performed in the crystal structure of hafnium oxide that has been, in an initial state, the crystal structure of Pbca, P4$_2$/nmc, the AS structure having antiferroelectricity, the FS structure having ferrielectricity, or the WS crystal structure having weak ferroelectricity.

In order to perform phase transition to the ferroelectric substance from the antiferroelectric substance or the ferrielectric substance while exceeding the saddle point of potential sensed by the displaced oxygen atom, the energy applied to the hafnium oxide film is, preferably, 100 meV or more in the crystal structure changing process.

As described above, according to the present embodiment, it is possible to implement, by using the additive-free hafnium oxide, the ferroelectric film that can reduce manufacturing cost and perform low-temperature formation, the semiconductor device that can reduce manufacturing cost and perform low-temperature formation, and the manufacturing method for the semiconductor device that can reduce manufacturing cost and perform low-temperature formation.

Second Embodiment

A semiconductor device according to the present embodiment is same as a first embodiment except for being a FeRAM of one-transistor type (1T type). A structure and a manufacturing method for a ferroelectric film are same as the first embodiment. Therefore, a description for the matters overlapping with the first embodiment will be omitted.

Figure 3:
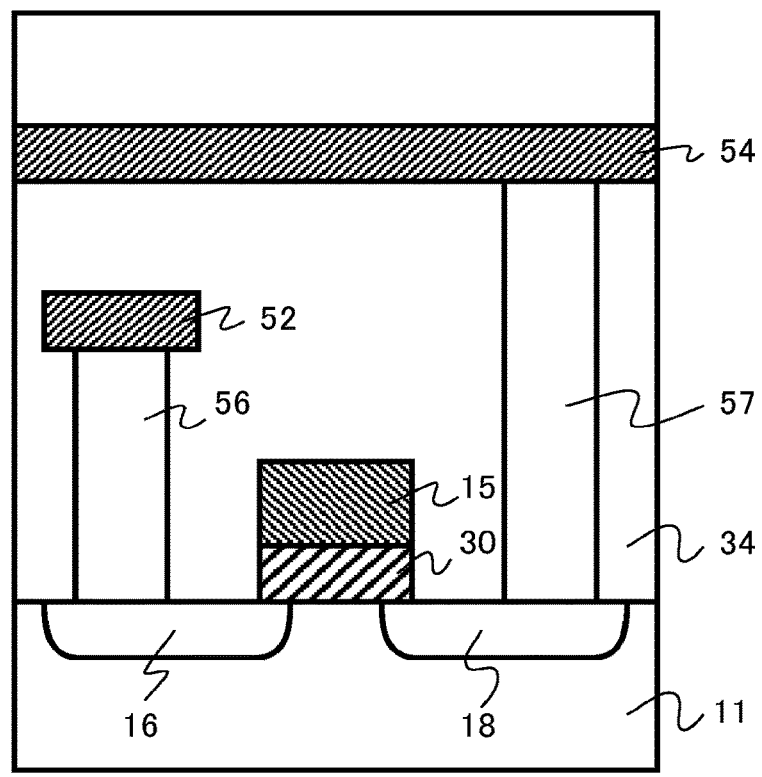
FIG. 3 is a schematic cross-sectional view illustrating a semiconductor device according to a second embodiment.

FIG. 3 is a schematic cross-sectional view illustrating a semiconductor device according to the present embodiment. The semiconductor device according to the present embodiment is the one-transistor type (1T type) FeRAM including a capacitor of a ferroelectric substance.

The semiconductor device according to the present embodiment includes a semiconductor substrate (first conductive layer) 11, a ferroelectric film 30 of hafnium oxide formed on the semiconductor substrate 11, and a gate electrode (second conductive layer) 15 formed on the ferroelectric film 30.

A source impurity layer 16 and a drain impurity layer 18 are formed on a surface of the semiconductor substrate 11 on both sides of the gate electrode 15.

A transistor for memory selection is formed of the semiconductor substrate (first conductive layer) 11, ferroelectric film 30, gate electrode (second conductive layer) 15, source impurity layer 16, and drain impurity layer 18. Further, the capacitor to store memory data is formed of the semiconductor substrate (first conductive layer) 11, ferroelectric film 30, and gate electrode (second conductive layer) 15. The capacitor of the present embodiment has a so-called metal/ferroelectrics/semiconductor (MFS) type structure.

According to the present embodiment, the ferroelectric film 30 functions as agate insulating film. Further, the gate electrode 15 functions as a word line of the FeRAM.

The semiconductor substrate 11 is, for example, single-crystal silicon (Si). The gate electrode 15 is formed of, for example, conductive metal and a metallic compound. An example is titanium nitride (TiN). The source impurity layer 16 and the drain impurity layer 18 are formed by, for example, diffusing arsenide (As) that is an n-type impurity into the semiconductor substrate 11.

In the ferroelectric film 30 of hafnium oxide according to the present embodiment, a sum of hafnium (Hf) and oxygen (O) is 98 atomic percent or more. The hafnium oxide according to the present embodiment is additive-free hafnium oxide to which elements other than hafnium (Hf) and oxygen (O) are not actively added. The ferroelectric film 30 is a ferroelectric film that can be manufactured by a manufacturing method same as the first embodiment.

The semiconductor device according to the present embodiment includes a first bit line 52 and a second bit line 54. The first bit line 52 is electrically connected to the source impurity layer 16 via a contact plug 56. The second bit line 54 is connected to the drain impurity layer 18 via the contact plug 57. The first bit line 52, second bit line 54, contact plug 56a, and contact plug 56b are formed of, for example, conductive metal and metallic compounds.

An interlayer dielectric film 34 is provided between respective wiring, electrode, and the contact plugs. The interlayer dielectric film 34 is, for example, a silicon oxide film.

In the FeRAM according to the present embodiment, a memory cell is selected by the word line at the time of data writing, and a polarization direction of the ferroelectric film 30 is changed by applying voltage between the first bit line 52 and the second bit line 54. At the time of data reading, whether the data is "1" or "0" is determined by a value of current flowing between the first bit line 52 and the second bit line 54.

Meanwhile, the capacitor also can have a metal/ferroelectrics/insulator/semiconductor (MFIS) type structure by providing an insulation film between the semiconductor substrate 11 and the ferroelectric film 30. According to this structure, there is an advantage in which spontaneous polarization of the ferroelectric film 30 is kept for a longer period.

As exemplary materials of the insulation film, $P2_1/c$ phase $HfO_2$, Fm3m phase $HfO_2$, $ZrO_2$, $Hf_{1-x}Zr_xO_2$ (however, $|x-0.5|\geq 0.1$), HfON, ZrON, $SiO_2$, SiON, HfSiO, HfSiON, HfAlO, HfAlON, ZrSiO, ZrSiON, ZrAlO, ZrAlON, TaO, HfTaO, AlO, AlON, HfLaO, LaAlO, LaAlON, HfYO, HfYON, etc. can be used.

According to the present embodiment, it is possible to implement, by using the additive-free hafnium oxide, the semiconductor device that can reduce manufacturing cost and perform low-temperature formation and the manufacturing method for the semiconductor device that can reduce manufacturing cost and perform low-temperature formation.

Third Embodiment

A semiconductor device according to the present embodiment includes: a structure including insulation layers and gate electrodes alternately stacked; a semiconductor layer facing at least one of the gate electrodes; and a ferroelectric layer including hafnium oxide provided between the semiconductor layer and the at least one of the gate electrodes, a sum of hafnium (Hf) and oxygen (O) in the hafnium oxide being 98 atomic percent or more. A semiconductor device according to the present embodiment differs from the first or second embodiment in being a non-volatile semiconductor memory device having a three-dimensional structure using a bit-cost scalable (BiCS) technology. A ferroelectric film is same as that of the first or second embodiment. Therefore, a description for the matters overlapping with the first or second embodiment will be omitted.

Figure 4:
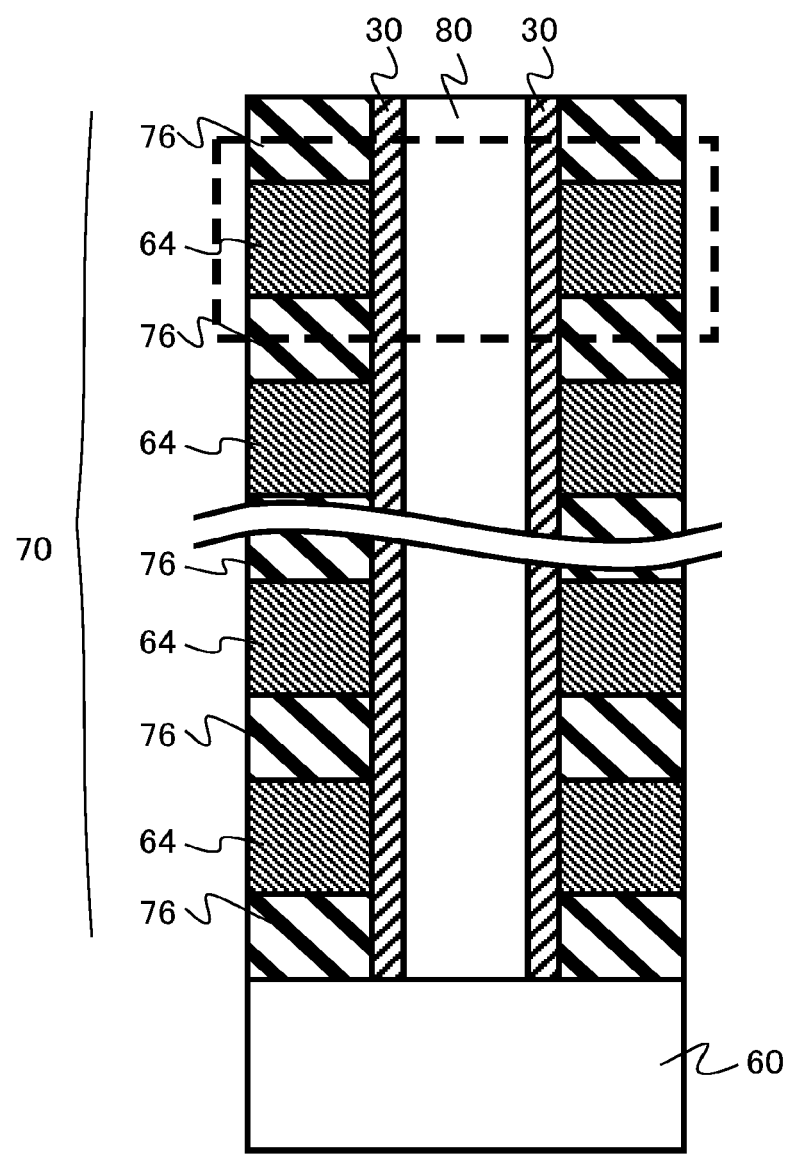
FIG. 4 is a schematic cross-sectional view illustrating a semiconductor device according to a third embodiment.

FIG. 4 is a schematic cross-sectional view illustrating a semiconductor device according to the present embodiment. The semiconductor device according to the present embodiment includes, for example, a stacked body 70 (structure) in which insulation layers 76 and control gate electrode layers 64 are alternately stacked in multiple layers on a silicon substrate 60. The insulation layer 76 is, for example, a silicon oxide film. Further, the control gate electrode layer (second conductive layer) 64 is, for example, polycrystalline silicon having conductivity obtained by doping impurities.

Further, a hole that runs through from an upper surface of the stacked body 70 to the control gate electrode layer 64 of the lowest layer is provided. Furthermore, a ferroelectric film 30 of hafnium oxide is provided on a side surface inside the hole.

In the ferroelectric film 30 of hafnium oxide according to the present embodiment, the sum of hafnium (Hf) and oxygen (O) is 98 atomic percent or more. The hafnium oxide according to the present embodiment is additive-free hafnium oxide to which elements other than hafnium (Hf) and oxygen (O) are not actively added. The ferroelectric film 30 is a ferroelectric film that can be manufactured by a manufacturing method same as the first embodiment.

Further, a column-like semiconductor layer (first conductive layer) 80 is formed on an inner surface of the ferroelectric film 30. The semiconductor layer 80 is, for example, silicon.

Note that an area surrounded by a dotted line is one memory cell in FIG. 4. The memory cell has a structure in which the ferroelectric film 30 is formed on the semiconductor layer (first conductive layer) 80 and the control gate electrode layer 64 is formed on the ferroelectric film 30. The memory cell of the present embodiment has a so-called metal/ferroelectrics/semiconductor (MFS) type structure. Further, the memory cell is the cell of a FeRAM of a one-transistor type, and the same cells are vertically connected in series.

According to the semiconductor device of the present embodiment, it is possible to implement, by using the additive-free hafnium oxide, the semiconductor device that can reduce manufacturing cost and perform low-temperature formation and the manufacturing method for the semiconductor device that can reduce manufacturing cost and perform low-temperature formation. Further, according to the present embodiment, integration of the memory cells is increased by three-dimensionally forming the memory cells, and the semiconductor device having integration higher than the first or second embodiment can be implemented.

Fourth Embodiment

A semiconductor device according to the present embodiment differs from the first to third embodiments in being a non-volatile semiconductor memory device having a three-dimensional structure using a vertical-gate ladder bit-cost scalable: VLB (VL-BiCS) technology. A ferroelectric film is same as those of the first to third embodiments. Therefore, a description for the matters overlapping with the first to third embodiments will be omitted.

Figure 5:
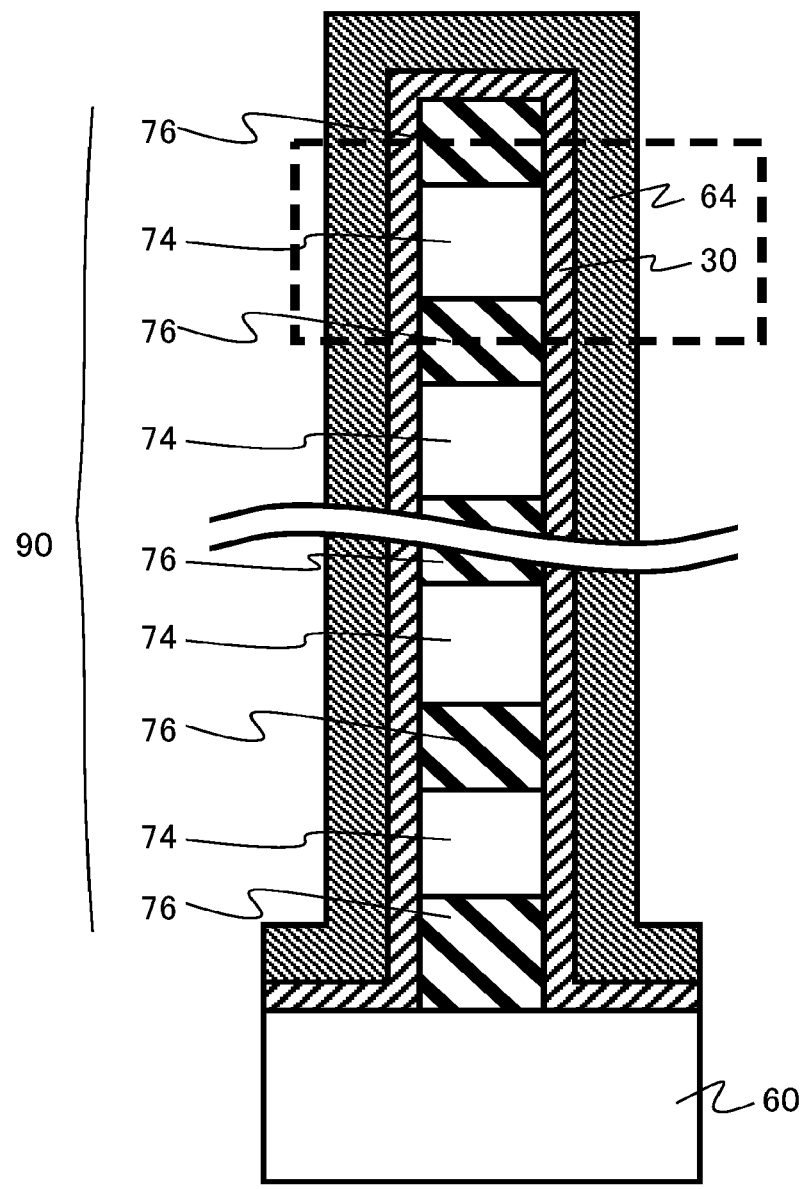
FIG. 5 is a schematic cross-sectional view illustrating a semiconductor device according to a fourth embodiment.

FIG. 5 is a schematic cross-sectional view illustrating a semiconductor device according to the present embodiment. The semiconductor device according to the present embodiment includes, for example, a stacked body 90 in which insulation layers 76 and semiconductor layers (first conductive layers) 74 are alternately stacked in multiple layers on a silicon substrate 60. The insulation layer 76 is, for example, a silicon oxide film. Further, the semiconductor layer 74 is, for example, single-crystal silicon.

Furthermore, a plate-like structure is formed on the substrate 60 by processing the stacked body 90. A ferroelectric film 30 of hafnium oxide is provided on a side surface of the plate-like structure.

In the ferroelectric film 30 of hafnium oxide according to the present embodiment, the sum of hafnium (Hf) and oxygen (O) is 98 atomic percent or more. The hafnium oxide according to the present embodiment is additive-free hafnium oxide to which elements other than hafnium (Hf) and oxygen (O) are not actively added. The ferroelectric film 30 is a ferroelectric film that can be manufactured by a manufacturing method same as the first embodiment.

Further, a control gate electrode layer (second conductive layer) 64 is formed on an outer surface of the ferroelectric film 30.

Note that an area surrounded by a dotted line is one memory cell in FIG. 5. The memory cell has a structure in which the ferroelectric film 30 is formed on the semiconductor layer (first conductive layer) 74 and the control gate electrode layer 64 is formed on the ferroelectric film 30. Further, the memory cell is a cell of a FeRAM of a one-transistor type. The memory cell of the present embodiment has a so-called metal/ferroelectrics/semiconductor (MFS) type structure.

According to the semiconductor device of the present embodiment, it is possible to implement, by using the additive-free hafnium oxide, the semiconductor device that can reduce manufacturing cost and perform low-temperature formation and the manufacturing method for the semiconductor device that can reduce manufacturing cost and perform low-temperature formation. Further, according to the present embodiment, integration of the memory cells is increased by three-dimensionally forming the memory cells, and the semiconductor device having integration higher than the first or second embodiment can be implemented.

Fifth Embodiment

A semiconductor device according to the present embodiment differs from the first to fourth embodiments in being a non-volatile semiconductor memory device using a ferroelectric tunnel junction (FTJ) device utilizing a ferroelectric thin film. A ferroelectric film is same as those of the first to fourth embodiments. Therefore, a description for the matters overlapping with the first to fourth embodiments will be omitted.

Figure 6:
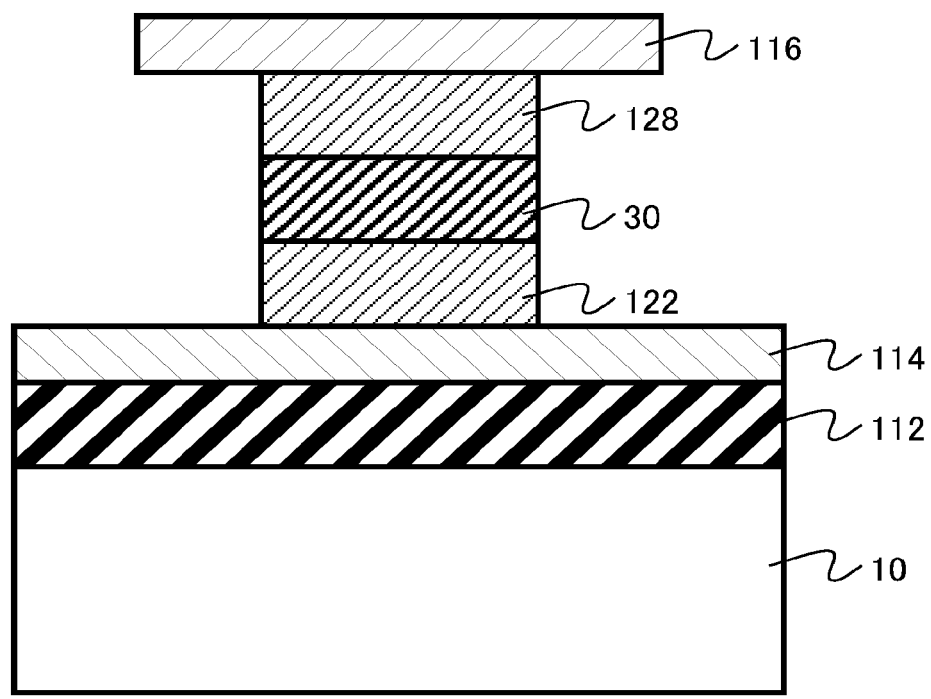
FIG. 6 is a schematic cross-sectional view illustrating a semiconductor device according to a fifth embodiment.

FIG. 6 is a schematic cross-sectional view illustrating the semiconductor device according to the present embodiment. The semiconductor device of the present embodiment is the non-volatile semiconductor memory device using the FTJ including a ferroelectric substance.

The semiconductor device according to the present embodiment includes, as illustrated in FIG. 6, a two-terminal FTJ device interposed between first electrode wiring 114 and second electrode wiring 116. The FTJ device functions as a memory cell by utilizing change of a current amount of tunnel current caused by polarization reversal of the ferroelectric substance.

The memory cell is provided in an area where the first electrode wiring 114 intersects with the second electrode wiring 116. The semiconductor device according to the present embodiment has a so-called cross-point structure.

A semiconductor substrate 10 is, for example, a single-crystal silicon (Si) substrate having a (100) plane. In addition, a single-crystal germanium substrate, a SiGe epitaxial substrate, an InP substrate, a GaN substrate, a GaAs substrate, an IGZO substrate, or the like can be also used. The substrate is preferably suitable for forming a peripheral circuit using a semiconductor device.

An insulation film 112 is, for example, a silicon oxide film such as $SiO_2$ film. Not limited to the silicon oxide film, any film that can keep an electrical insulation property between the semiconductor substrate 10 and the wiring may be applied, for example, an $Al_2O_3$ film, a SiON film, a SiN film, a single-crystal or amorphous $HfO_2$ film, a single-crystal or amorphous $ZrO_2$ film, a single-crystal or amorphous $Hf_{1-x}M_xO_{2-y}$ film (M includes one or more of Si, Y, Zr, Al, Sr, Gd, La, Ce, Pr, Nd, Sm, Eu, Tb, Dy, Ho, Er, Tm, Yb, Lu, and Sc), a HfSiO film, a HfSiON film, a ZrSiO film, a ZrSiON film, a SiOC film, or a mixture of these films.

For example, the first electrode wiring 114 is a word line, and the second electrode wiring 116 is a bit line. The first electrode wiring 114 and the second electrode wiring 116 are metal wiring, for example. Exemplary materials of the metal wiring are Cu, Al, Ta, Mo, TiN, TaN, and MoN.

Further, materials of the first electrode wiring 114 and the second electrode wiring 116 can also be carbon nanotube and graphene. Any material having conductivity may be applied as the materials of the first electrode wiring 114 and the second electrode wiring 116.

As illustrated in FIG. 6, the memory cell has a structure in which a lower electrode (first conductive layer) 122, a ferroelectric film 30 of hafnium oxide, and an upper electrode (second conductive layer) 128 are stacked in a direction from the first electrode wiring 114 side to the second electrode wiring 116. The memory cell of the present embodiment has a so-called metal/ferroelectrics/metal (MFM) type structure.

The lower electrode 122 is formed on the first electrode wiring 114. In the lower electrode 122, preferably, a value obtained by multiplying the number of oxygen ions inside the layer by a valence 2 of oxygen is smaller than a value obtained by multiplying the number of positive ions by a valence of the positive ion. Preferably, a material of the lower electrode 122 has low oxygen concentration and high heat resistance.

The material of the lower electrode 122 is, for example, metal nitride. The metal nitride is, for example, titanium nitride (TiN). Further, another exemplary material of the lower electrode 122 is resistance-reduced polycrystalline silicon obtained by doping n-type or p-type impurities at high concentration, or amorphous silicon. The concentration of the n-type or p-type impurities is, preferably, $1 \times 10^{20}$ atoms/cm$^3$ or more.

As the materials of the lower electrode 122, for example, Ru, Ir, Os, Pt, Rh, Pd, Ta, Nb, W, Mo, Hf, Zr, Re, Ti, Ni, Co, Fe, Mn, Cr, V, Ti, graphene, amorphous carbon, CuN, CuAlN, SrN, BaN, SrAlN, BaAlN, TiN, ZrN, HfN, TiAlN, ZrAlN, HfAlN, VN, NbN, TaN, VAlN, NbAlN, TaAlN, CrN, MoN, WN, CrAlN, MoAlN, WAlN, MnN, MnAlN, ReN, ReAlN, FeN, FeN, CoN, CoN, NiN, CuSi, MgSi, CaSi, SrSi, BaSi, LnSi (Ln is one or more of La, Ce, Pr, Nd, Sm, Eu, Gd, Tb, Dy, Ho, Er, Tm, Yb, L), TiSi, ZrSi, HfSi, VSi, NbSi, TaSi, CrSi, MoSi, WSi, MnSi, FeSi, CoSi, NiSi, CaC, SrC, BaC, BC, AlC, SiC, TiC, ZrC, HfC, VC, NbC, TaC, CrC, MoC, WC, MnC, ReC, MgB, CaB, SrB, BaB, AlB, LnB (Ln is one or more of La, Ce, Pr, Nd, Sm, Eu, Gd, Tb, Dy, Ho, Er, Tm, Yb, and L), TiB, ZrB, HfB, NbB, TaB, MoB, WB, MnB, FeB, CoB, NiB, MgNi, CaNi, LnNi (Ln is one or more of La, Ce, Pr, Nd, Sm, Eu, Gd, Tb, Dy, Ho, Er, Tm, Yb, and L), NiTi, NiZr, NiHf can be also used besides TiN, polycrystalline silicon, and amorphous silicon. Further, metal atoms that can be positive ions, or oxygen atoms that can be negative ions having the number less than the number of carbon atoms may also be included.

The ferroelectric film 30 is provided on the lower electrode 122. In the ferroelectric film 30 of hafnium oxide according to the present embodiment, the sum of hafnium (Hf) and oxygen (O) is 98 atomic percent or more. The hafnium oxide according to the present embodiment is additive-free hafnium oxide to which elements other than hafnium (Hf) and oxygen (O) are not actively added. The ferroelectric film 30 is a ferroelectric film that can be manufactured by a manufacturing method same as the first embodiment.

The upper electrode (second conductive layer) 128 is provided on the ferroelectric film 30.

The material of the upper electrode 128 is, for example, metal nitride. The metal nitride is, for example, titanium nitride (TiN). Further, another exemplary material of the upper electrode 128 is resistance-reduced polycrystalline silicon obtained by doping n-type or p-type impurities at high concentration, or amorphous silicon. The concentration of the n-type or p-type impurities is, preferably, $1 \times 10^{20}$ atoms/cm$^3$ or more.

As the materials of the upper electrode 128, for example, Ru, Ir, Os, Pt, Rh, Pd, Ta, Nb, W, Mo, Hf, Zr, Re, Ti, Ni, Co, Fe, Mn, Cr, V, Ti, graphene, amorphous carbon, CuN, CuAlN, SrN, BaN, SrAlN, BaAlN, TiN, ZrN, HfN, TiAlN, ZrAlN, HfAlN, VN, NbN, TaN, VAlN, NbAlN, TaAlN, CrN, MoN, WN, CrAlN, MoAlN, WAlN, MnN, MnAlN, ReN, ReAlN, FeN, FeN, CoN, CoN, NiN, CuSi, MgSi, CaSi, SrSi, BaSi, LnSi (Ln is one or more of La, Ce, Pr, Nd, Sm, Eu, Gd, Tb, Dy, Ho, Er, Tm, Yb, L), TiSi, ZrSi, HfSi, VSi, NbSi, TaSi, CrSi, MoSi, WSi, MnSi, FeSi, CoSi, NiSi, CaC, SrC, BaC, BC, AlC, SiC, TiC, ZrC, HfC, VC, NbC, TaC, CrC, MoC, WC, MnC, ReC, MgB, CaB, SrB, BaB, AlB, LnB (Ln is one or more of La, Ce, Pr, Nd, Sm, Eu, Gd, Tb, Dy, Ho, Er, Tm, Yb, and L), TiB, ZrB, HfB, NbB, TaB, MoB, WB, MnB, FeB, CoB, NiB, MgNi, CaNi, LnNi (Ln is one or more of La, Ce, Pr, Nd, Sm, Eu, Gd, Tb, Dy, Ho, Er, Tm, Yb, and L), NiTi, NiZr, NiHf can be also used besides TiN, polycrystalline silicon, and amorphous silicon. Further, metal atoms that can be positive ions, or oxygen atoms that can be negative ions having the number less than the number of carbon atoms may also be included.

Meanwhile, the lower electrode 122 and the upper electrode 128 may be formed of either a same material or different materials. Of course, preferably, materials having different work functions are applied to the lower electrode 122 and the upper electrode 128 from the viewpoint of making the memory cell have a rectifying function.

The second electrode wiring 116 is provided on the upper electrode 128.

According to the semiconductor device of the present embodiment, polarization of the ferroelectric film 30 is reversed by applying voltage between the first electrode wiring 114 and the second electrode wiring 116 at the time of data writing. Further, at the time of data reading, the data of memory cell is read as an amount of current flowing between the first electrode wiring 114 and the second electrode wiring 116. Then, polarity of the data is discriminated by determining the amount of current that depends on a polarization direction of the ferroelectric film 30. For example, whether the data is "0" or "1" is determined.

According to the present embodiment, it is possible to implement, by using the additive-free hafnium oxide, the semiconductor device that can reduce manufacturing cost and perform low-temperature formation and the manufacturing method for the semiconductor device that can reduce manufacturing cost and perform low-temperature formation. Further, according to the present embodiment, integration of the memory cells is increased by having the cross-point structure, and the semiconductor device having integration higher than the first or second embodiments can be implemented.

Modified Example

Figure 7:
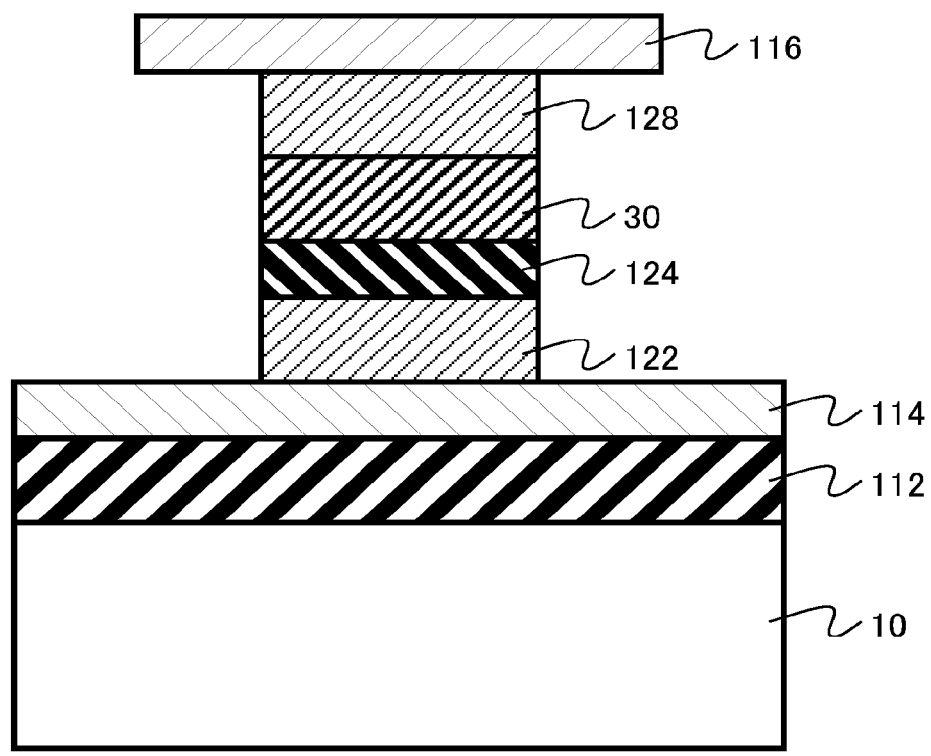
FIG. 7 is a schematic cross-sectional view illustrating a semiconductor device according to a modified example of the fifth embodiment.

FIG. 7 is a schematic cross-sectional view illustrating a semiconductor device according to a modified example of the present embodiment. The semiconductor device according to the present modified example differs from the fifth embodiment in including a paraelectric film 124 between the lower electrode (first conductive layer) 122 and the ferroelectric film 30.

As illustrated in FIG. 7, the memory cell of the present modified example has a structure in which the lower electrode (first conductive layer) 122, paraelectric film 124, ferroelectric film 30 of hafnium oxide, and upper electrode (second conductive layer) 128 are stacked in the direction from the first electrode wiring 114 side to the second electrode wiring 116. The memory cell of the present embodiment has a so-called metal/ferroelectrics/insulator/metal (MFIM) type structure.

The paraelectric film 124 functions as a tunnel insulation film that allows carriers to flow as tunnel current at the time of writing, reading, and erasing data of the memory cell. Further, since the paraelectric film 124 is interposed, an FTJ device has a diode function, more specifically, a rectification property.

According to the present modified example also, it is possible to implement, by using the additive-free hafnium oxide, the semiconductor device that can reduce manufacturing cost and perform low-temperature formation and the manufacturing method for the semiconductor device that can reduce manufacturing cost and perform low-temperature formation.

EXAMPLES

In the following, examples of the present disclosure will be described.

First Example

A device having an MIM structure is manufactured by a following method.

A TiN film having a film thickness of 10 nm is formed by the sputtering method as a lower electrode on a (100) plane silicon substrate subjected to RCA cleaning. Even when a diamond cantilever of an atomic force microprobe (AFM) is made to contact with the TiN film at pressure of 4 µN, no damage is observed.

Next, an antiferroelectric hafnium oxide film having a film thickness of 10 nm is formed on the TiN film by the sputtering method. Sputtering conditions are: (1) the substrate temperature is set to a room temperature, (2) sputtering gas pressure is set to 0.5 Pa or less, (3) the substrate and a target are arranged off-axially, and (4) a gas flow ratio of $Ar:O_2$ is set to 10:1.

Composition of yttrium oxide ($YO_{1.5}$) of the hafnium oxide film is changed in a range from 0 atomic percent (no additive) to 8 atomic percent.

Next, a TiN film having a film thickness of 10 nm is formed on the hafnium oxide film as an upper electrode by the sputtering method. Even when the diamond cantilever of an atomic force microprobe (AFM) is made to contact with the TiN film at pressure of 4 µN, no damage is observed.

Next, heat treatment is applied in a nitrogen atmosphere for 20 seconds. The heat treatment temperature is changed in a range from 500° C. to 1000° C.

After the heat treatment, capacitance voltage (CV) is measured while applying voltage between the lower electrode and the upper electrode so as to change the voltage from 0 V to +3 V by passing once +3 V and then passing −3 V. A voltage application period is 30 seconds or more and 90 seconds or less in a range from 30 Hz to 1 MHz. After that, the same CV measurement is repeated two more times.

Figure 8A:
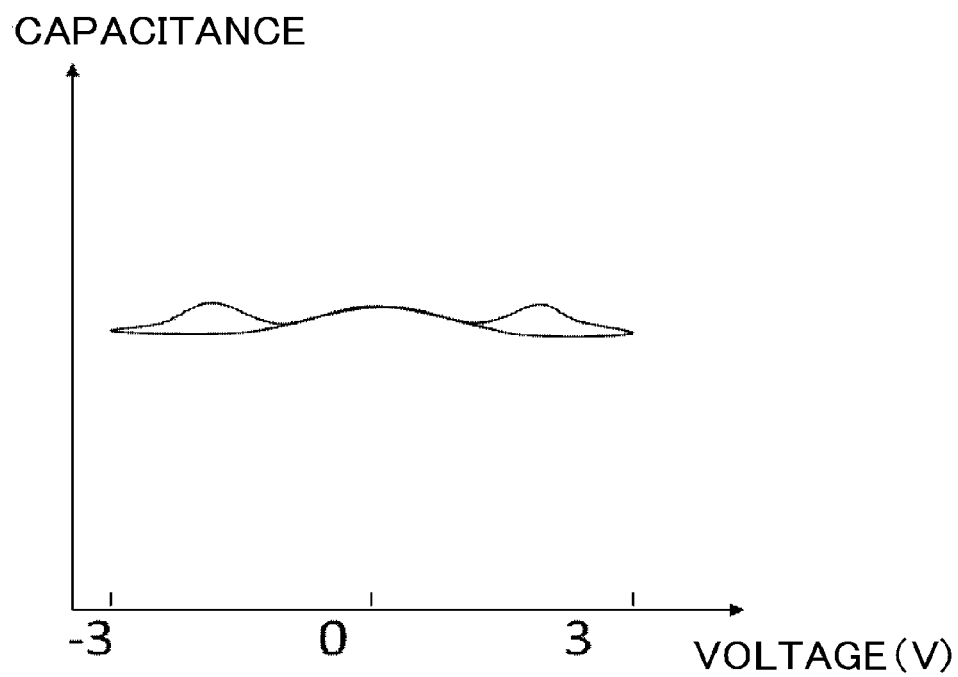
FIGS. 8A and 8B are diagrams illustrating exemplary CV measurement according to a first example.
Figure 8B:
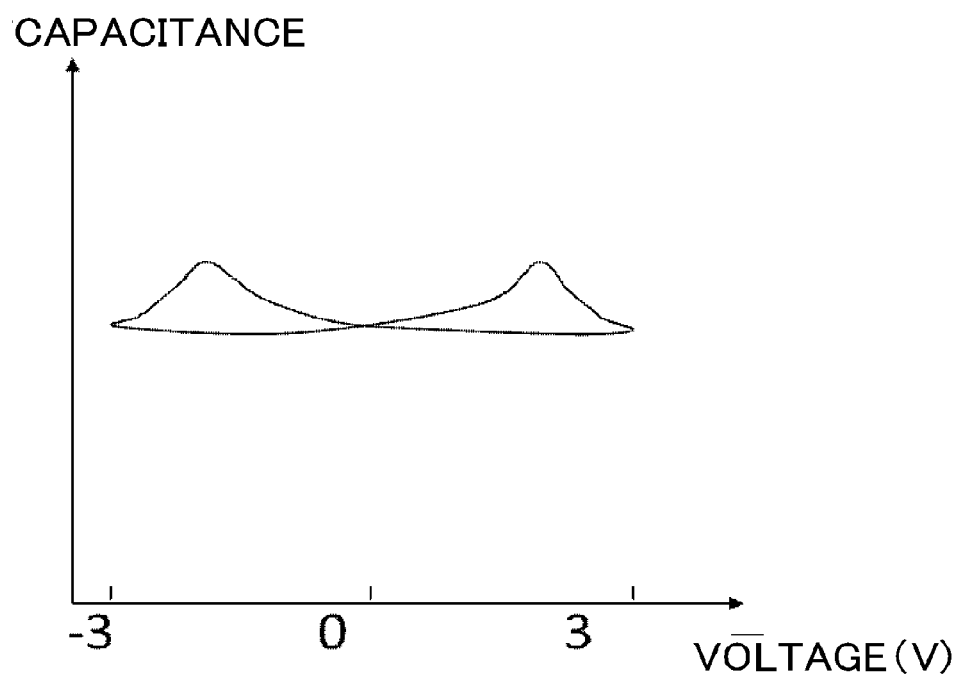

FIGS. 8A and 8B are diagrams illustrating exemplary CV measurement according to the present example. FIGS. 8A and 8B provide results in the case where the composition of yttrium oxide ($YO_{1.5}$) of the hafnium oxide film is 0 atomic percentage (no additive) and the heat treatment temperature is 700° C. FIG. 8A is the result of first CV measurement, and FIG. 8B is the result of second CV measurement. In this sample, a CV characteristic indicating antiferroelectricity is obtained in the first CV measurement, and a CV characteristic indicating ferroelectricity is obtained in the second and later measurement. For example, in the case where the composition of yttrium oxide ($YO_{1.5}$) of the hafnium oxide film 1 atomic percent and the heat treatment temperature is 700° C., the CV characteristic is antiferroelectric in the first measurement, slightly ferroelectric in the second measurement, and completely ferroelectric in the third measurement.

Figure 9:
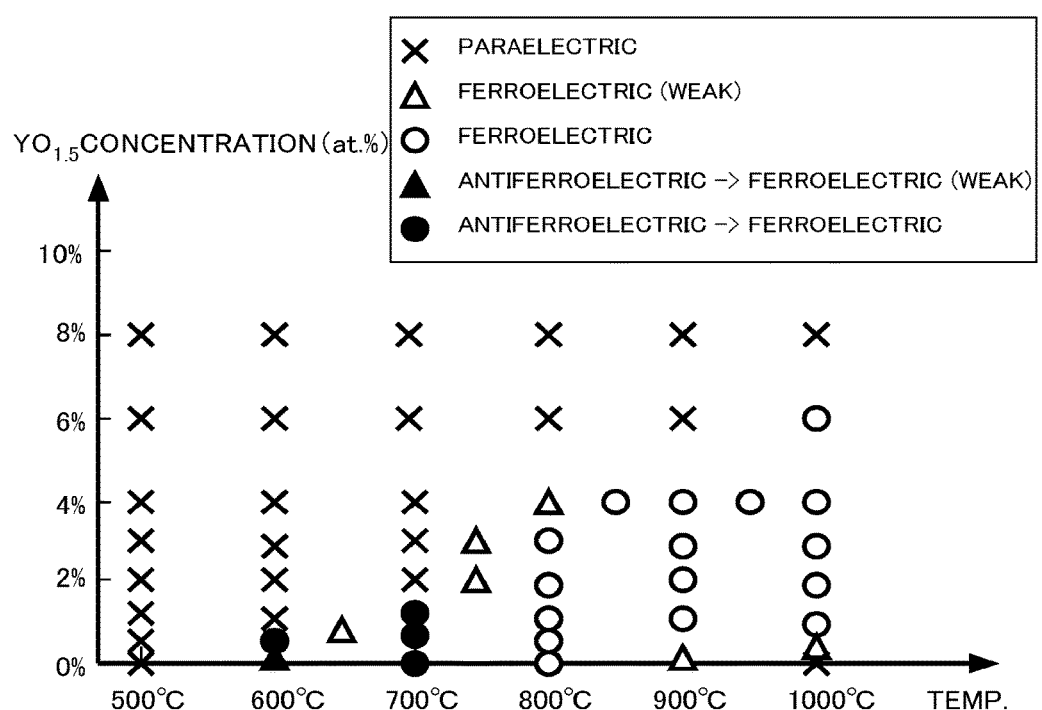
FIG. 9 is a diagram illustrating results of the first example.

FIG. 9 is a diagram illustrating results of the present example. FIG. 9 shows dependence of the characteristic of hafnium oxide film on the composition and the heat treatment temperature judged from the determination based on the CV characteristics. A triangle mark and a circle mark painted in black indicate the sample that indicates antiferroelectricity in the first CV measurement but indicates ferroelectricity in the second and later CV measurement. Further, the triangle mark indicates a case where ferroelectricity is weaker than the circle mark.

As is clear from FIG. 9, ferroelectricity is realized in the additive-free hafnium oxide film in the heat treatment temperature range from 600° C. to 900° C.

Further, a shift amount of a Raman peak 514 $cm^{-1}$ of the silicon substrate is examined by Raman spectroscopy using ultraviolet light, and it is found that the shift amount of the peak is 0.11 $cm^{-1}$ or less in many samples. More specifically, it is found that a biaxial stress value relative to the substrate surface is 0.023 GPa. It is confirmed that stress of the substrate in a range of 5 nm from a TiN interface is kept at a sufficiently low value to be applied to the semiconductor device, and further it is also confirmed that stress, namely, reaction force against the upper and lower TiN films and hafnium oxide film is also a sufficiently low value such as 0.012 GPa or less in the same manner.

Second Example

A device having an MIS structure is manufactured by a following method.

An additive-free antiferroelectric hafnium oxide film having a film thickness of 10 nm is formed by the sputtering method on a (100) plane p-type silicon substrate subjected to RCA cleaning. The sputtering conditions are: (1) the substrate temperature is set to the room temperature, (2) the sputtering gas pressure is set to 1 Pa or more, (3) the substrate and a target are arranged off-axially, and (4) the gas flow ratio of $Ar:O_2$ is set to 10:1.

Next, a TiN film having a film thickness of 8 nm is formed on the hafnium oxide film as the upper electrode by the sputtering method. Even when the diamond cantilever of an atomic force microprobe (AFM) is made to contact with the TiN film at pressure of 1500 µN, no damage is observed.

Next, heat treatment is applied in the nitrogen atmosphere at 700° C. for 20 seconds.

After the heat treatment, CV measurement is performed while applying voltage between the upper electrode and the silicon substrate (lower electrode) so as to change the voltage from +1 V to +1 V by once passing −5 V. The voltage application period is 30 seconds or more and 90 seconds or less in a range from 30 Hz to 1 MHz. After that, the same CV measurement is repeated two more times.

Figure 10A:
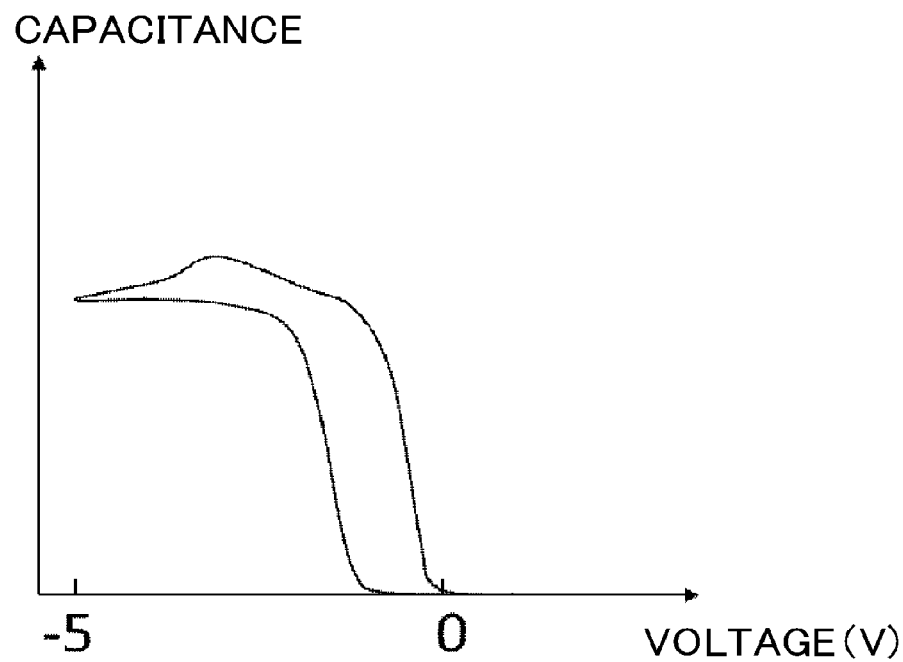
FIGS. 10A and 10B are diagrams illustrating exemplary CV measurement according to a second example.
Figure 10B:
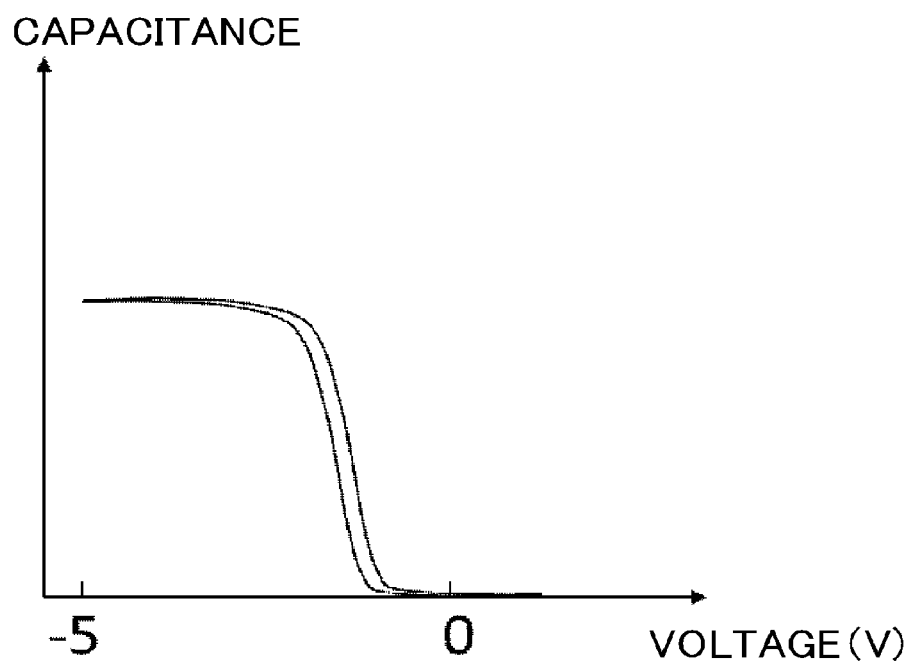

FIGS. 10A and 10B are diagrams illustrating exemplary CV measurement according to the present example. FIG. 10A is a result of first CV measurement, and FIG. 10B is a result of third CV measurement.

In the first measurement, a dielectric constant increase caused by polarization reversal is observed in the vicinity of +3 V. Since the substrate of the present device is a p-type doped semiconductor, it is difficult to apply desired voltage to the ferroelectric substance because a depletion layer is generated at an interface with the ferroelectric hafnium oxide film when the substrate side is in a positive state. Therefore, unless otherwise an initial imprint phenomenon or the like occurs at the ferroelectric hafnium oxide film, polarization reversal once generated should be kept as it is. Therefore, it is expected that a CV characteristic not causing polarization reversal is obtained in the second measurement. However, a CV characteristic indicating ferroelectricity is obtained also in the second measurement.

Assuming that the reason why polarization reversal is caused also in the second measurement is that spontaneous polarization is returned to zero in a no voltage state due to occurrence of the initial imprint phenomenon at the ferroelectric hafnium oxide film, polarization reversal should be obtained also in the third measurement the same manner. However, in the third measurement, a CV characteristic not causing polarization reversal is obtained.

Since the initial imprint phenomenon is caused by a relatively essential reason such as interface stress applied to the ferroelectric substance, it is unlikely that the initial imprint phenomenon is resolved by one-time voltage application. Based on the fact that the CV characteristic indicating antiferroelectricity is observed in the first measurement and the CV characteristic indicating ferroelectricity is observed in the second measurement in the MFM device of the first example, following explanation may be provided. More specifically, in the first measurement, the spontaneous polarization is returned to zero because polarization reversal in the MFM device of the present example is polarization reversal of antiferroelectricity. In the second measurement, polarization reversal is caused because the antiferroelectric substance is changed to the ferroelectric substance and the spontaneous polarization is kept as it is. That may be why polarization reversal is not observed in the third measurement.

Therefore, it is confirmed that the additive-free hafnium oxide film is changed to the ferroelectric film also in the device structure of the present example.

Third Example

An FTJ device having an MIFM structure is manufactured by a following method.

A TiN film having a film thickness of 8 nm is formed as the lower electrode by the sputtering method on a (100) plane silicon substrate subjected to RCA cleaning. Even when the diamond cantilever of an atomic force microprobe (AFM) is made to contact with the TiN film at pressure of 1500 µN, no damage is observed.

Next, a silicon oxide film having a film thickness of 1 nm is formed on the TiN film by the sputtering method.

Subsequently, an additive-free antiferroelectric hafnium oxide film having a film thickness of 10 nm is formed on the silicon oxide film by the sputtering method. The sputtering conditions are: (1) the substrate temperature is set to the room temperature, (2) the sputtering gas pressure is set to 1 Pa or more, (3) the substrate and a target are arranged off-axially, and (4) the gas flow ratio of $Ar:O_2$ is set to 10:1.

Next, a TiN film having a film thickness of 8 nm is formed on the hafnium oxide film as the upper electrode by the sputtering method. Even when the diamond cantilever of an atomic force microprobe (AFM) is made to contact with the TiN film at pressure of 1500 µN, no damage is observed.

Next, heat treatment is applied in the nitrogen atmosphere at 700° C. for 20 seconds.

After the heat treatment, IV (I: current-voltage) measurement is performed while applying voltage between the upper electrode and the lower electrode so as to change the voltage from 0 V to +3 V by passing once +3 V and then passing −3 V. The voltage application period is 1E-5 seconds or less. After that, second and later IV measurement is performed in the same manner.

Figure 11:
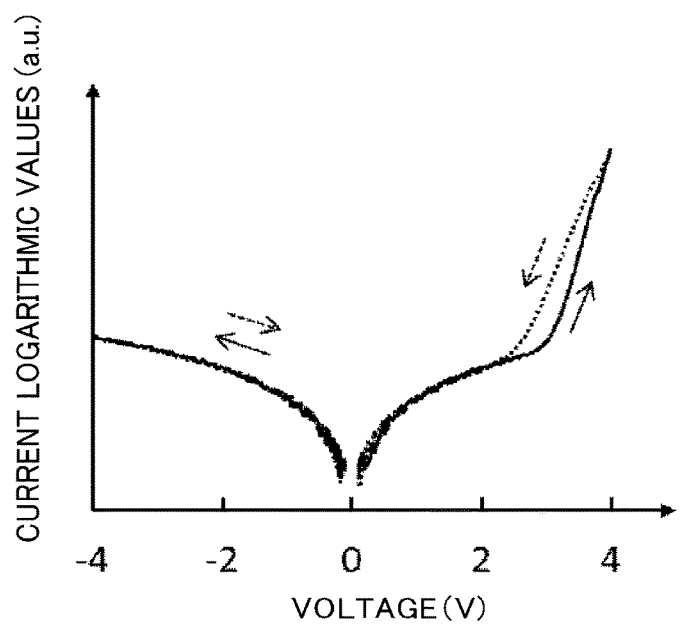
FIG. 11 is a diagram illustrating an exemplary IV measurement according to a third example.

FIG. 11 is a diagram illustrating an exemplary IV measurement according to the present example. FIG. 11 is a result of the second IV measurement.

In the first measurement, a characteristic that seems to be caused by antiferroelectric tunnel junction (ATJ) is indicated, but in the second and later measurement, a characteristic indicating operation as the FTJ device is obtained as illustrated in FIG. 11.

Besides the non-volatile semiconductor memory device having the three-dimensional structure described in the embodiments, the present disclosure is applicable to non-volatile semiconductor memory devices having other three-dimensional structures such as a pipe-shaped bit-cost scalable (P-BiCS), a terabit cell array transistor (TCAT), a vertical gate (VG)-NAND, a vertical channel (VC)-NAND, a cross-point-NAND, a VSAT (vertical stacked array transistor), a vertical-recess-array-transistor (VRAT), a vertical gate-thin film transistor (VG-TFT)-NAND, a dual control-gate with surrounding floating-gate (DC-SF), a PN diode decoded vertical gate (PNVG), a hybrid stacked 3d (Hybrid 3D), a Si pillar 3D NAND, a stacked NAND, and a multi TFT stacked-surrounding gate transistor (S-SGT).

Further, a structure in which the FTJ devices described in the embodiments are stacked in multiple layers can also be adopted. By stacking the FTJ devices in the multiple layers, integration of the non-volatile semiconductor memory device is improved.

Further, according to the embodiments, the exemplary cases of applying the ferroelectric film of hafnium oxide to the non-volatile semiconductor memory device has been described. However, the ferroelectric film of hafnium oxide can also be applied to other devices such as an infrared bolometer and a tunable RF circuit utilizing a property as a high resilient body of the ferroelectric substance.

While certain embodiments have been described, these embodiments have been presented by way of example only, and are not intended to limit the scope of the inventions. Indeed, a semiconductor device, a manufacturing method for a semiconductor device, and a ferroelectric film described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device, comprising:
a plurality of memory cells;
a structure including insulation layers and gate electrodes alternately stacked; and
a semiconductor layer extending in a stacking direction of the structure, the semiconductor layer facing the gate electrodes;
wherein each of the plurality of memory cells has a transistor structure, the transistor structure includes a gate terminal, a gate insulating film, and a semiconductor region,
wherein the gate terminal is a part of one of the gate electrodes, the semiconductor region is a part of the semiconductor layer,
wherein the gate insulating film is provided between the gate terminal and the semiconductor region, the gate insulating film includes a ferroelectric layer, hafnium oxide is a main component of the ferroelectric layer, a sum of hafnium (Hf) and oxygen (O) in the hafnium oxide is 98 atomic percent or more, a crystal structure of a space group Pbc21 (space group number 29) is main crystal structure in the hafnium oxide, and
wherein the transistor structures of the plurality of memory cells are connected in series in the stacking direction of the structure.

2. The device according to claim 1, wherein a sum of hafnium (Hf), oxygen (O), and zirconium (Zr) in the hafnium oxide is 99 atomic percent or more.

3. The device according to claim 1, wherein the ferroelectric layer has a thickness of 10 nm or less.

4. The device according to claim 1, wherein the device is configured to read data memorized in each of the plurality of memory cells based on current flowing from one end of the semiconductor layer to the other end of the semiconductor layer.

5. A semiconductor device, comprising:
- a plurality of memory cells;
- a structure including insulation layers and gate electrodes alternately stacked; and
- a semiconductor layer extending in a stacking direction of the structure, the semiconductor layer facing the gate electrodes;
- wherein each of the plurality of memory cells has a transistor structure, the transistor structure includes a gate terminal, a gate insulating film, and a semiconductor region,
- wherein the gate terminal is a part of one of the gate electrodes, the semiconductor region is a part of the semiconductor layer,
- wherein the gate insulating film is provided between the gate terminal and the semiconductor region, the gate insulating film includes a ferroelectric layer including hafnium oxide, a sum of hafnium (Hf) and oxygen (O) in the hafnium oxide is 98 atomic percent or more, a crystal structure of the hafnium oxide is a space group Pbc21 (space group number 29), and
- wherein the transistor structures of the plurality of memory cells are connected in series in the stacking direction of the structure.

6. The device according to claim 5, wherein a sum of hafnium (Hf), oxygen (O), and zirconium (Zr) in the hafnium oxide is 99 atomic percent or more.

7. The device according to claim 5, wherein the ferroelectric layer has a thickness of 10 nm or less.

8. The device according to claim 5, wherein the device is configured to read data memorized in each of the plurality of memory cells based on current flowing from one end of the semiconductor layer to the other end of the semiconductor layer.

* * * * *